United States Patent
Clark

(10) Patent No.: US 7,573,157 B1
(45) Date of Patent: Aug. 11, 2009

(54) HIGH-POWER ELECTRICAL PULSES USING METAL OXIDE VARISTORS

(75) Inventor: Miles Collins Clark, Albuquerque, NM (US)

(73) Assignee: Fiore Industries, Inc., Albuquerque, NM (US)

(*) Notice: Subject to any disclaimer, the term of this patent is extended or adjusted under 35 U.S.C. 154(b) by 243 days.

(21) Appl. No.: 11/321,010

(22) Filed: Dec. 28, 2005

Related U.S. Application Data

(60) Provisional application No. 60/639,259, filed on Dec. 28, 2004.

(51) Int. Cl.
*H03K 3/64* (2006.01)

(52) U.S. Cl. .................................................. 307/106

(58) Field of Classification Search .............. 361/118; 307/130, 106
See application file for complete search history.

(56) References Cited

U.S. PATENT DOCUMENTS

| | | | |
|---|---|---|---|
| 4,463,268 A | | 7/1984 | Levinson |
| 5,175,506 A | * | 12/1992 | Parsons ................ 315/505 |
| 5,222,492 A | * | 6/1993 | Morgan et al. ............ 607/5 |
| 5,535,087 A | * | 7/1996 | Puckett et al. ............ 361/118 |

OTHER PUBLICATIONS

Fan et al., Transition of MOV Distribution Arresters from Capacittive to Resistive During Steep-Front Impulses, Jun. 7-10, 1992 IEEE, International Symposium on Electrical Insulation, pp. 452-455.*
Parsons, et al., "Voltage Regulation In a Linear Induction Accelerator Using Metal-Oxide Varistors", Los Alamos National Laboratory, Los Alamos, NM 87545, (1990 IEEE), 544-547.
Penney, et al., "Design and Testing of the Power Electronics for the Cannon Caliber Electromagnetic Gun System", IEEE Transactions on Magnetics, vol. 33, No. 1, Jan. 1997, 484-489.

* cited by examiner

*Primary Examiner*—Albert W Paladini
*Assistant Examiner*—Michael Rutland Wallis
(74) *Attorney, Agent, or Firm*—Deborah A. Peacock; Justin R. Jackson; Peacock Myers, P.C.

(57) ABSTRACT

A circuit and method for creating a high-power electrical pulse which has a smooth or flat-topped configuration as well as a very short rise time. A metal oxide varistor (MOV) is preferably placed in parallel with a load and a switch is preferably placed in series between the MOV and the load.

15 Claims, 4 Drawing Sheets

HIGH-POWER ELECTRICAL PULSES USING METAL OXIDE VARISTORS

CROSS-REFERENCE TO RELATED APPLICATIONS

This application claims priority to and the benefit of the filing of U.S. Provisional Patent Application Ser. No. 60/639,259, entitled "A New Method for Producing High Power Constant Voltage Electrical Pulses Using Metal Oxide Varistors (MOVs)", filed on Dec. 28, 2004, and the specification thereof is incorporated herein by reference.

STATEMENT REGARDING FEDERALLY SPONSORED RESEARCH OR DEVELOPMENT

The U.S. Government has a paid-up license to this invention and the right in limited circumstances to require the patent owner to license others on reasonable terms as provided for by the terms of Contract No. FA9451-05-D-0004 awarded by the United States Department of Defense.

BACKGROUND OF THE INVENTION

1. Field of the Invention (Technical Field)

The present invention relates to an electrical circuit and method for creating flat-topped high power electrical pulses, particularly with the use of metal oxide varistors (MOVs).

2. Description of Related Art

Metal oxide varistors (MOVs) have been known and used for some time. The most typical use of MOVs is to protect electronic equipment from voltage spikes. The most common metal oxide varistors contain granules of zinc-oxide sandwiched between a pair of conductive plates. Typically, one lead of a varistor is connected to a supply line ($V_s$) and another lead of the MOV is connected to ground. Under typical operating conditions, only a very small amount of current flows from one conductive plate, through the zinc-oxide, and to the other conductive plate. This is because of the relatively high resistance of the zinc-oxide. However, when a voltage spike occurs at a voltage which is greater than the breakdown voltage of spaces around the zinc-oxide granules, current then easily flows around the zinc-oxide granules and the MOV thus acts as a short from $V_s$ to ground. The voltage at which this occurs is known as the clamping voltage of the MOV. When the MOV acts as a short to ground, the vast majority of all current that is supplied to the electronic device stops flowing to the device and instead travels through the MOV to ground. Because most voltage spikes that an electronic circuit is likely to experience typically last for only a small fraction of a second, the amount of time that the MOV acts as a short to ground is correspondingly very short and thus the MOV does not typically overheat.

One of the most demanding problems for systems designed to generate high power microwave and charged particle beams is the production of the required electrical pulses. Typical voltages are in excess of several hundred thousand volts at currents of about 10,000 amps or more for pulses lasting up to about 1 uS in duration. These pulses must maintain voltage within fairly narrow constraints (typically +/−10 percent) in order to be useful. In addition, the time for the voltage to reach a maximum after application (the rise time) must be rather short (often less than about 100 nanoseconds). A number of techniques are typically employed to accomplish this task. These include pulse forming networks and pulse forming lines using liquid or solid dielectrics.

Recently, MOVs have begun to be used in pulsed power applications (see *Simulation, Design and Test of a MOV Pulse Shaping Device for High Power Microwave Generators*, by M. Giesselmann, Pulsed Power Conference, 1999. Digest of Technical Papers. 12$^{th}$ IEEE International, Volume: 2, PP. 27-30 Jun. 1999; and Voltage Regulation in a *Linear Induction Accelerator Using Metal-Oxide Varistors*, by W. M. Parsons, IEEE Conference Record of the 1990 Nineteenth Power Modulator Symposium PP. 544-547). These references fail to describe the ability to repeatedly shape numerous pulses with a MOV, particularly one which is driven by a Marx-type generator. In addition, the prior art fails to adequately address the need for a peak smoothing system which also provides for a very rapid rise time.

There currently exists a need for an inexpensive manner by which smooth-topped, high-power pulses can be produced and particularly for a method to produce flat-topped, high-power voltage pulses having a very rapid rise time.

BRIEF SUMMARY OF THE INVENTION

The present invention is directed to a circuit for providing high-power voltage pulses to a load; preferably flat-topped, high-power voltage pulses. The circuit preferably has a high-voltage direct current source, a metal oxide varistor comprising a first terminal connected to ground, and a first switch which connects the source to a second terminal of the metal oxide varistor. A load and a second switch for connecting the load in parallel with the metal oxide varistor are also preferably provided.

The circuit may also have an inductor in series with the direct current source. The high-voltage direct current source may include, but is not limited to, a charged capacitor and a generator, including a Marx generator and/or a Cockroft-Walton generator. If a charged capacitor is used, it is preferably charged to a voltage in excess of a clamping voltage of the metal oxide varistor.

The present invention also relates to a method for providing a high-power voltage pulse, preferably a flat-topped, high-power voltage pulse. The method comprises providing a high voltage source, connecting a metal oxide varistor between the high voltage source and ground, disposing a load in parallel with the metal oxide varistor, providing a voltage to the metal oxide varistor but not the load, (the voltage exceeding a clamping voltage of the metal oxide varistor), and subsequently flowing current through the load.

The voltage to the metal oxide varistor may be provided by, but is not limited to, a high-voltage generator, or a capacitor charged to a high voltage, including a Marx generator, and/or a high-voltage Cockroft-Walton generator.

The current flows through an inductor. The switch is preferably disposed between the metal oxide varistor and the high-voltage source. The switch may be closed between the load and the metal oxide varistor. There may be a delay before closing the switch. The clamping voltage of the metal oxide varistor may be exceeded before the switch is closed. The voltage may be monitored across the metal oxide varistor.

An object of the present invention is to provide a circuit and method for creating a high-power electrical pulse wherein the voltage of the pulse preferably has a flat top.

An advantage of the present invention is that a circuit and method are provided which allow for the production of high-power electrical pulses.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

DETAILED DESCRIPTION OF THE INVENTION

The present invention relates to the use of a metal oxide varistor (MOV) to produce pulse shaping, thus eliminating the need for conventional solutions which rely on more complex pulse forming networks.

The term "switch" as used throughout the specification and claims is used for the sake of simplicity and is intended to include any and all apparatuses, structures, elements, materials, methods or combinations thereof capable of switching on and/or off a flow of electricity. As such, the term "switch" can include, but is not limited to: mechanical switches, spark gaps, triggered spark gaps, krytrons, sprytrons, thyratrons, other vacuum tubes typically used in switching high voltage sources, combinations thereof, and the like.

The term "high-voltage" as used throughout the specification and claims is intended to include any voltage equal to or greater than about 800 volts.

Figure 4A:
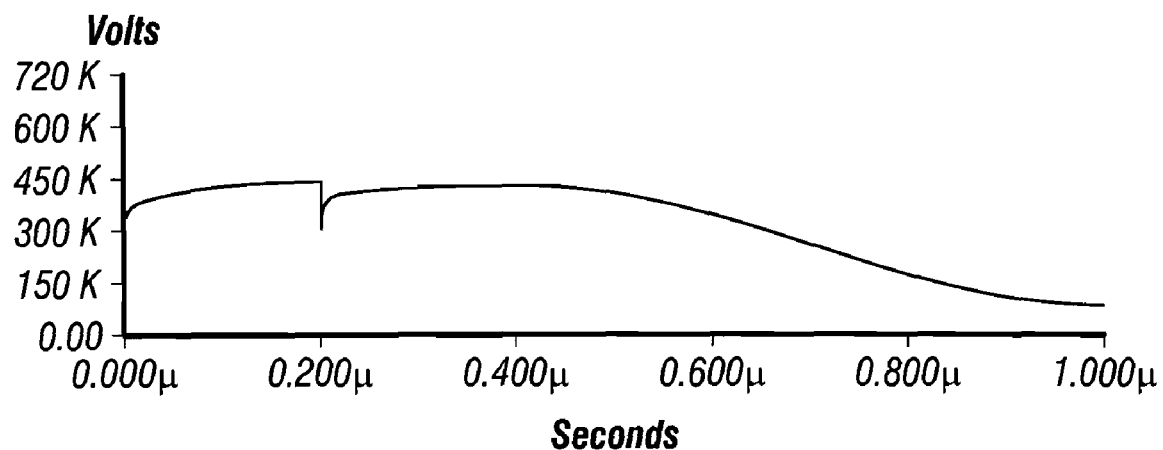
FIG. 4A is a graph depicting voltage across the MOV of FIG. 3 as a function of time wherein switch 2 is closed at time=0.2 μseconds.
Figure 4B:
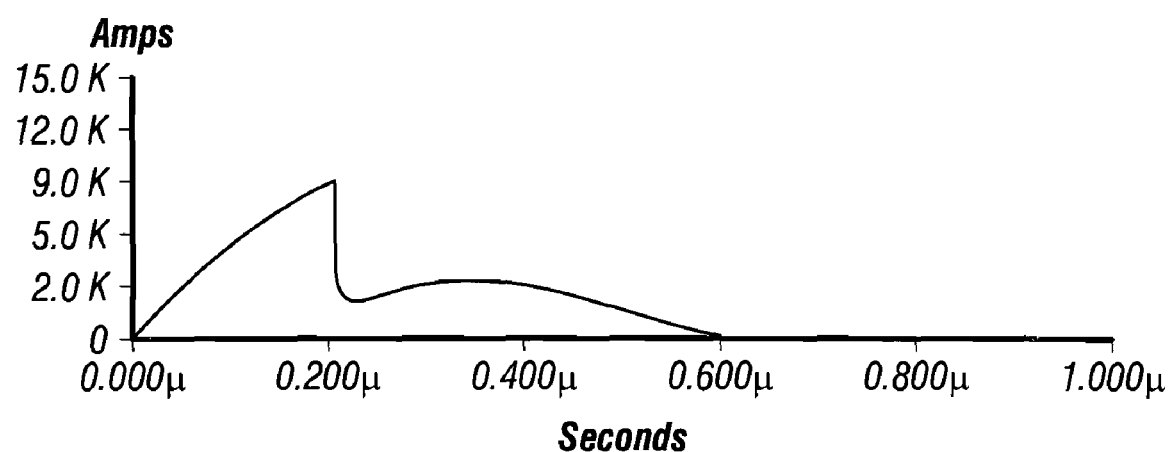
FIG. 4B is a graph depicting current across the MOV of FIG. 3 as a function of time wherein switch 2 is closed at time=0.2 μseconds.
Figure 4C:
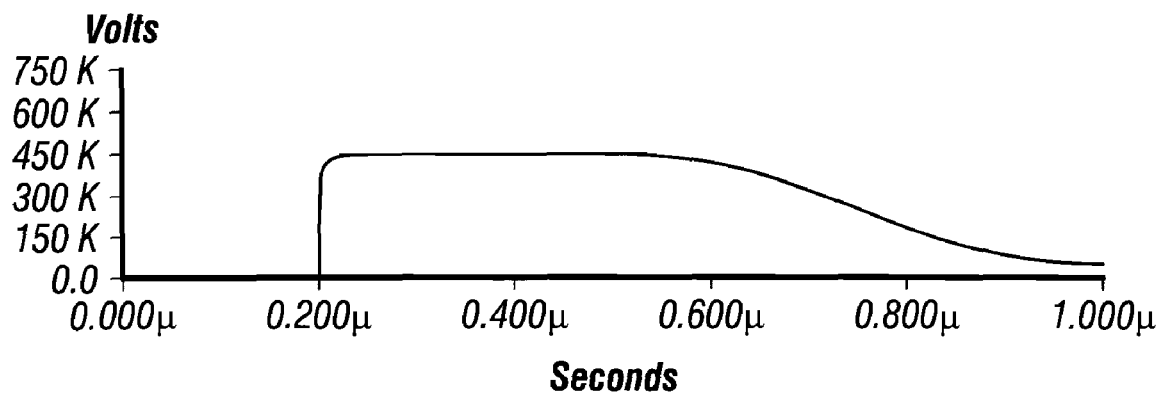
FIG. 4C is a graph depicting voltage across the load of FIG. 3 as a function of time wherein switch 2 is closed at time=0.2 μseconds.

The term "flat-topped" or "smooth-topped" as used throughout the specification and claims is intended to describe a voltage curve that is substantially flat or smooth over a period of time, such as depicted in FIG. 4C.

Figure 1:
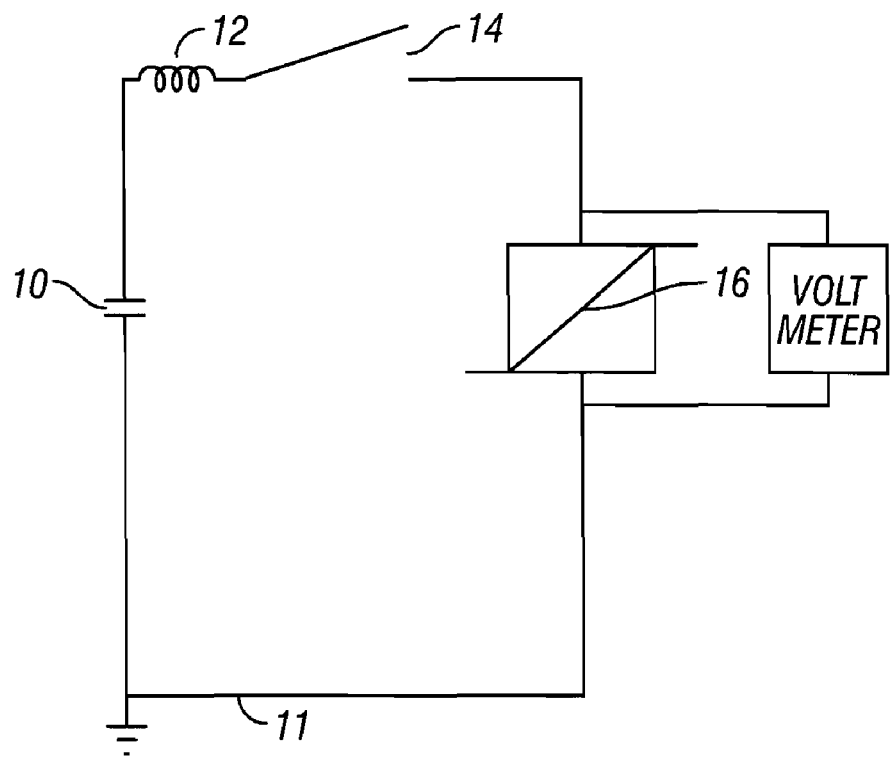
FIG. 1 is a schematic diagram illustrating a preferred embodiment of the present invention without a load connected thereto.
Figure 2A:
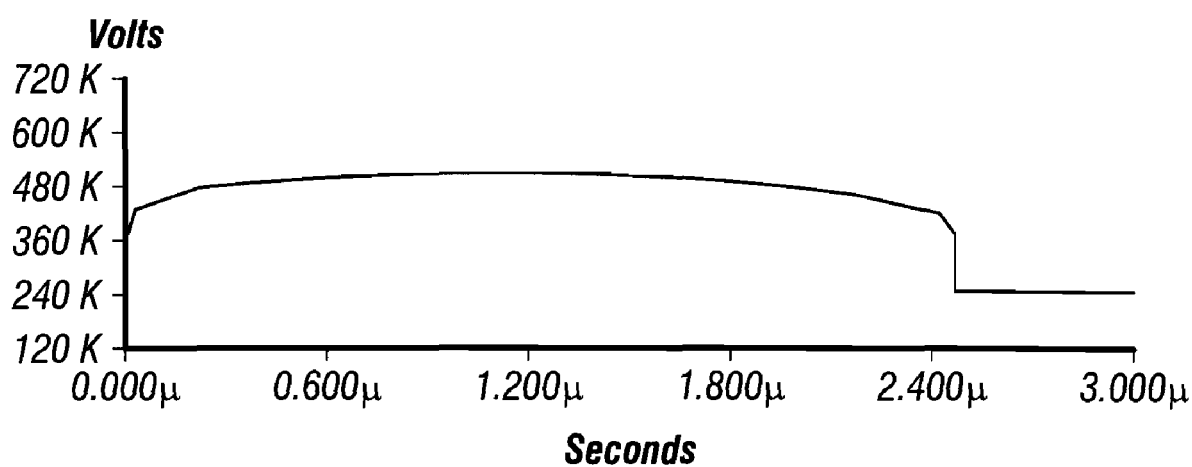
FIG. 2A is a graph depicting voltage across the metal oxide varistor (MOV) of FIG. 1 as a function of time.
Figure 2B:
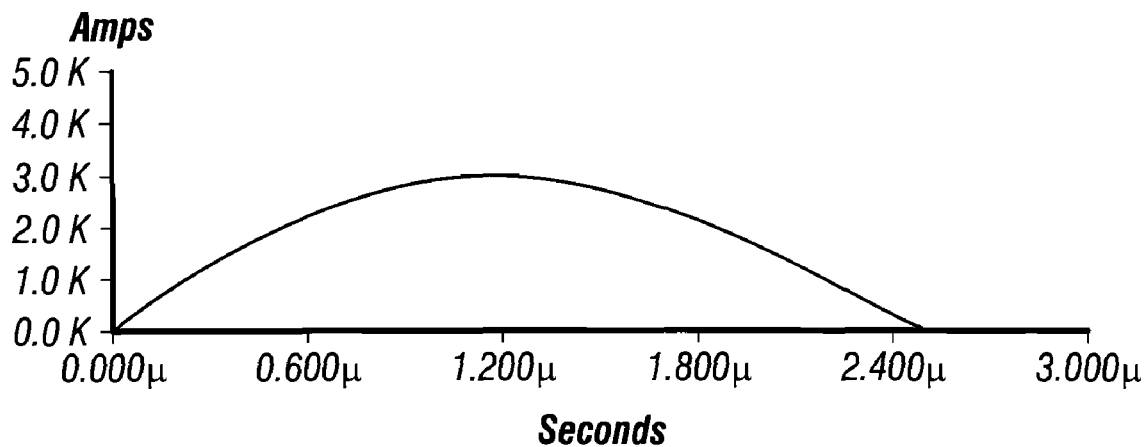
FIG. 2B is a graph depicting current across the MOV of FIG. 1 as a function of time.

The present invention makes use of the nonlinear characteristics of a MOV such that an extremely smooth-topped, high-power electrical pulse is produced. FIG. 1 depicts a schematic diagram wherein capacitor 10 is connected from ground point 11 to inductor 12. As illustrated in FIG. 1, switch 14 is connected in series between a first terminal of MOV 16 and inductor 12. A second terminal of MOV 16 is preferably connected to ground 11. Capacitor 10 is preferably charged to a voltage in excess of the clamping voltage of MOV 16. At time $t=t_o$, switch 14 is preferably closed, thus causing the capacitor 10 to discharge through inductor 12 and through MOV 16, back to ground 11. Because MOV 16 has a clamping voltage which is less than the charge voltage of capacitor 10, the voltage across MOV 16 is thus limited to approximately its clamping voltage. FIG. 2A is a graph illustrating a voltage across MOV 16. As depicted therein, the peak voltage of the pulse remains very constant with no spikes or ripples. Although the rise time of the pulse is somewhat short, a much shorter rise time is often required. FIG. 2B is a graph of the current through MOV 16. As can be seen from FIGS. 2A and 2B, although the peak voltage of the electrical pulse remains substantially constant, the current varies by a significant amount.

Figure 3:
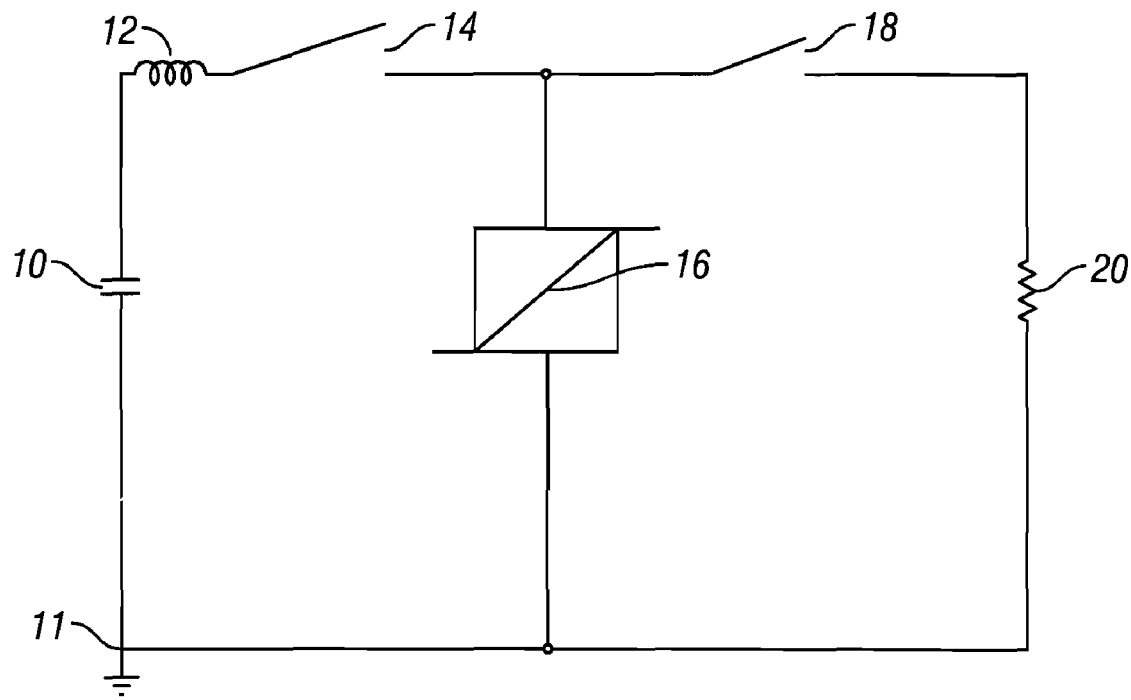
FIG. 3 is a schematic diagram illustrating a preferred embodiment of the present invention with a second switch and a load included therein.

An embodiment of the present invention is illustrated in FIG. 3. As illustrated therein, capacitor 10 is preferably connected from ground point 11 to inductor 12. Although capacitor 10 and inductor 12 are preferably provided, the presence of either is not essential to the operation of the present invention. Rather, desirable results can be produced so long as a high voltage direct current source of electricity is available. Switch 14 is preferably connected in series between a first terminal of MOV 16 and inductor 12, or another source of high-voltage direct current such as, but not limited to a generator, including but not limited to a Marx generator, a Cockroft-Walton generator, combinations thereof, etc. A second terminal of MOV 16 is preferably connected to ground 11. Switch 18 is preferably provided and connects load 20 in parallel with MOV 16 as depicted in FIG. 3.

In the embodiment of FIG. 3, switch 18 is preferably included such that load 20 can be connected across MOV 16 at a time after the initial voltage rise time of the pulse. This is preferably done by providing a very short delay from the time that switch 14 is closed until the time when switch 18 is closed, or by monitoring the voltage across MOV 16 and closing switch 18 in response to a predetermined comparison value for that measurement. The apparent rise time of the voltage across load 20 is thus much shorter. In the preferred embodiment illustrated in FIG. 3, load 20 experiences an electrical pulse having a voltage with a very rapid rise time and a very smooth peak. For this embodiment, FIG. 4A illustrates a graph of the voltage across MOV 16 and FIG. 4B illustrates a graph of the current through MOV 16 wherein switch 14 is closed at t=0 and switch 18 is closed at t=2 μseconds. FIG. 4C illustrates a graph of the voltage across load 18. As illustrated therein, no voltage is encountered by load 20 until switch 18 closes at t=2 μseconds. As further illustrated therein, the rise time of the voltage across load 20 is very short and the peak voltage of the electrical pulse is very flat-topped or smooth.

Figure 5:
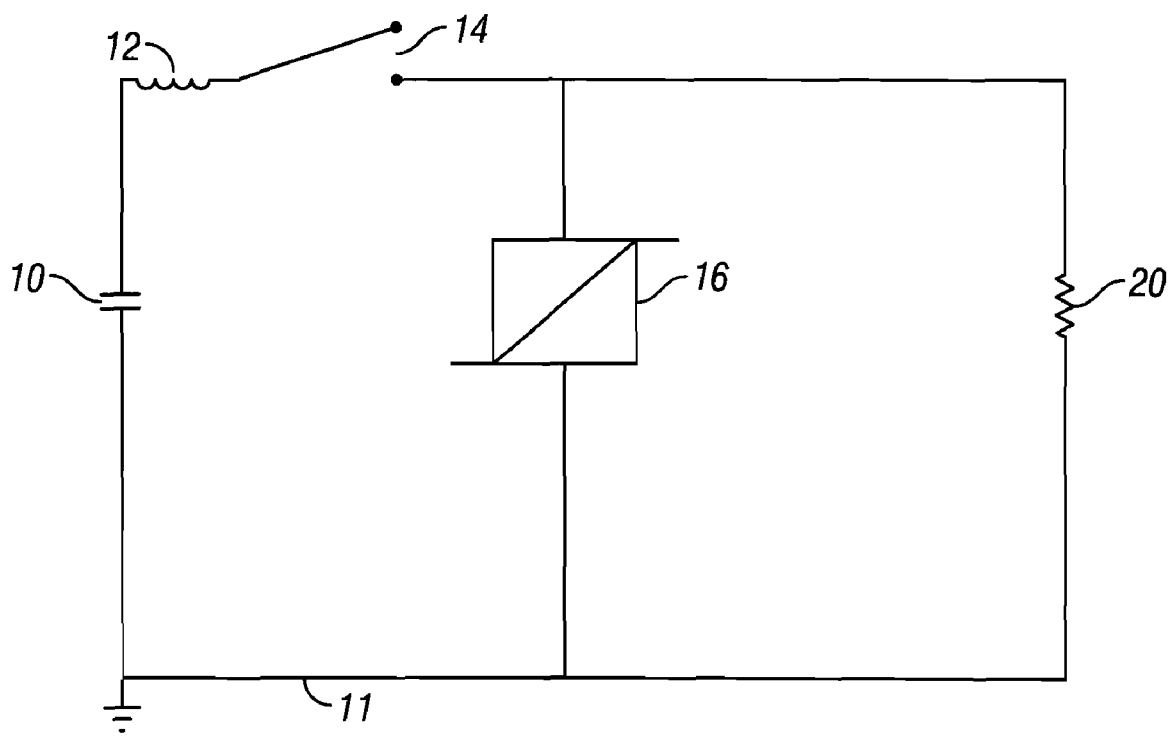
FIG. 5 is a schematic diagram illustrating an embodiment of the present invention wherein a load is connected directly across a MOV without the use of a second switch.

If an extremely short rise time is not required, but a flat-topped high power electrical pulse is still needed, switch 18 can be omitted, as depicted in the schematic illustration of FIG. 5. In this embodiment, the voltage across load 20 will rise in a fashion substantially similar to the voltage across an MOV alone. As such, a graph of an example of how the voltage across a load placed in parallel with an MOV but without a second switch is also illustrated in the graph of FIG. 2A.

The rise time can be adjusted by adjusting the closure time of switch 18. In an alternative embodiment of the present invention, the pulse-width across load 20 can be adjusted based on the selection of inductor 12. Optionally, the pulse-width across load 20 can also optionally be adjusted by adjusting the delay time before switch 18 is closed. Because of the small difference between the voltage across switch 18 before and after its closing, the switch volume can be reduced. Because switch 18 can be switched at any time and will result in an almost instantaneous voltage appearing across load 20, capacitor 10 need not have a low inductance value in order for a short voltage rise time to be observed across load 20. The present invention also provides the ability to drive a wide range of load impedances while still providing a short voltage rise time and a very flat-topped voltage pulse.

INDUSTRIAL APPLICABILITY

The invention is further illustrated by the following non-limiting examples.

EXAMPLE 1

A circuit in accordance with the present invention was simulated as illustrated in FIG. 1. Capacitor 10 was charged to a voltage in excess of the clamping voltage of MOV 16. At time=$t_o$, switch 14 was closed thus allowing current to flow through inductor 12, MOV 16 and to ground 11. Simulations of the voltage across MOV 16 were used to generate the graph of FIG. 2A. Simulations of the current through MOV 16 were used to generate the graph of FIG. 2B. As depicted in FIG. 2A, the voltage across MOV 16 quickly ramped up to the clamping voltage of MOV 16 (about 550,000 volts) and then remained relatively constant at that voltage until the voltage from capacitor 10 diminished to a value less than that amount, at which time the voltage across the MOV rapidly decreased to about 250,000 volts.

Although the voltage across MOV 16 reached its clamping voltage relatively quickly, thus clipping the voltage spike which would have occurred but for the clamping effect of MOV 16, as illustrated in the graph of FIG. 2B, the current though MOV 16 continued to rise before gradually decreasing.

EXAMPLE 2

Based upon the results observed in Example 1, the circuit illustrated in FIG. 3 was simulated. As can be seen from FIG. 3, the setup of the circuit of FIG. 1 was maintained but switch 18 was added in conjunction with load resistor 20.

In this example, capacitor 10 was again charged up to a voltage which exceeded the clamping voltage of MOV 16. Switch 14 was again closed at time=$t_o$ at which point capacitor 10 quickly began discharging through inductor 12 and MOV 16 to ground 11. Because the voltage of capacitor 10 was greater than the clamping voltage of MOV 16, MOV 16 immediately began clamping the voltage, thus creating the initially substantially square wave-shaped response depicted at the first portion of the graph of FIG. 4A. Until a time=0.2 μseconds, switch 18 was in an open position. At time=0.2 μseconds, however, switch 18 was closed, thus connecting load 20 in parallel with MOV 16. Beginning at t=0.2 μseconds, the voltage across load 20 was the same as the voltage across MOV 16. The current flowing through MOV 16 was simulated and plotted thus creating the graph of FIG. 4B. As can be seen in that graph, the current began to rise steadily from t=0.0μ until switch 18 was closed, thus allowing the current to also travel through load 20.

The voltage across load 20 was also simulated. FIG. 4C is a graph illustrating the results obtained for the voltage across load 20. As depicted by the graph of results obtained for the voltage across load 20, the circuit and method of the present invention were able to achieve a high-voltage pulse having a very smooth and flat or flat-topped peak while simultaneously providing an extremely short rise time.

The preceding examples can be repeated with similar success by substituting the generically or specifically described operating conditions of this invention for those used in the preceding examples.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above and/or in the attachments, and of the corresponding application(s), are hereby incorporated by reference.

What is claimed is:

1. A circuit for providing a flat-topped, high-power voltage pulse to a load comprising:
    a high-voltage direct current source;
    a metal oxide varistor comprising a first terminal and a second terminal;
    said first terminal of said metal oxide varistor connected to ground;
    a first switch, connecting said direct current source to said second terminal of said metal oxide varistor;
    a load;
    a second switch connecting said load in parallel with said metal oxide varistor; and
    said circuit producing a flat-topped, high-power voltage pulse to said load.

2. The circuit of claim 1 further comprising an inductor in series with said direct current source.

3. The circuit of claim 1 wherein said high-voltage direct current source comprises a charged capacitor.

4. The circuit of claim 1 wherein said high-voltage direct current source comprises a Marx generator.

5. The circuit of claim 1 wherein said high-voltage direct current source comprises a Cockroft-Walton generator.

6. The circuit of claim 3 wherein said charged capacitor is charged to a voltage in excess of a clamping voltage of the metal oxide varistor.

7. A method for producing a flat-topped, high-power voltage pulse comprising:
    providing a high voltage source;
    connecting a metal oxide varistor between the high voltage source and around;
    disposing a load in parallel with the metal oxide varistor;
    providing a voltage to the metal oxide varistor and not to the load, the voltage exceeding a clamping voltage of the metal oxide varistor;
    subsequently flowing current through the load comprising closing a switch between the load and the metal oxide varistor; and
    producing a flat-topped, high-power voltage pulse.

8. The method of claim 7 further comprising exceeding the clamping voltage of the metal oxide varistor before closing the switch.

9. The method of claim 7 further comprising monitoring a voltage across the metal oxide varistor.

10. The method of claim 7 further comprising providing a delay before closing the switch.

11. The method of claim 7 further comprising disposing a switch between the metal oxide varistor and a high-voltage source.

12. The method of claim 7 wherein providing a voltage to the metal oxide varistor comprises providing a high-voltage Marx generator.

13. The method of claim 7 wherein providing a voltage to the metal oxide varistor comprises providing a high-voltage Cockroft-Walton generator.

14. The method of claim 7 wherein providing a voltage to the metal oxide varistor comprises providing a capacitor charged to a high voltage.

15. The method of claim 7 further comprising flowing current through an inductor.

* * * * *

UNITED STATES PATENT AND TRADEMARK OFFICE
CERTIFICATE OF CORRECTION

| | | |
|---|---|---|
| PATENT NO. | : 7,573,157 B1 | Page 1 of 1 |
| APPLICATION NO. | : 11/321010 | |
| DATED | : August 11, 2009 | |
| INVENTOR(S) | : Miles Collins Clark | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 469 days.

Signed and Sealed this

Seventh Day of September, 2010

David J. Kappos
*Director of the United States Patent and Trademark Office*